March 24, 1959 H. W. LOEB 2,879,410
ELECTRIC CIRCUITS INCLUDING TRANSISTOR DEVICES
Filed June 24, 1955 3 Sheets-Sheet 1
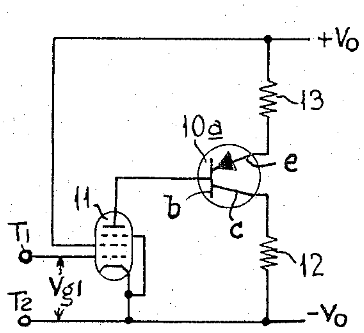
FIG. 1.
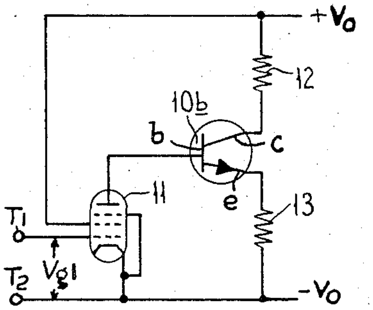
FIG. 2.
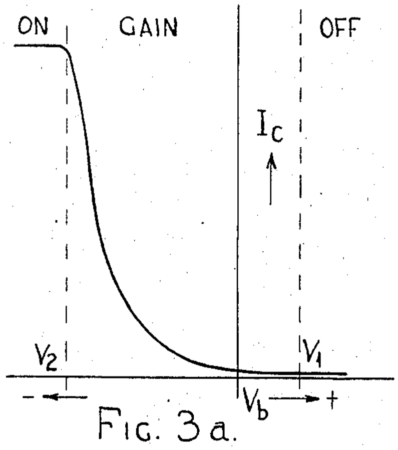
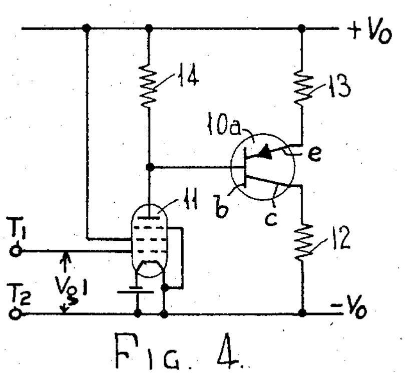
FIG. 4.
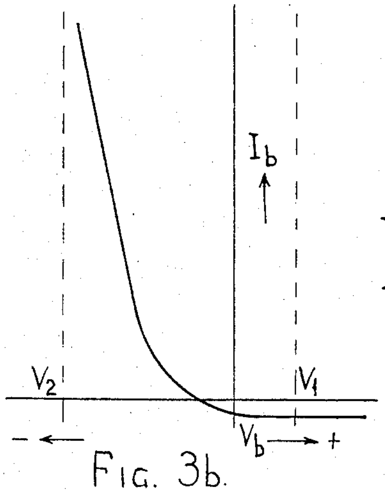
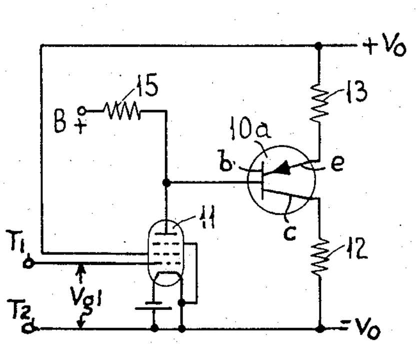
FIG. 5.
INVENTOR
HANS WALTER LOEB
BY Young, Emery & Thompson
ATTYS

ELECTRIC CIRCUITS INCLUDING TRANSISTOR DEVICES

Filed June 24, 1955 3 Sheets-Sheet 2

INVENTOR
HANS WALTER LOEB
By Young, Emery & Thompson
ATTYS.

March 24, 1959 H. W. LOEB 2,879,410

ELECTRIC CIRCUITS INCLUDING TRANSISTOR DEVICES

Filed June 24, 1955 3 Sheets-Sheet 3

INVENTOR

HANS WALTER LOEB

BY Young, Emery & Thompson

ATTYS.

United States Patent Office 2,879,410

Patented Mar. 24, 1959

2,879,410

ELECTRIC CIRCUITS INCLUDING TRANSISTOR DEVICES

Hans Walter Loeb, London, England, assignor to Automatic Telephone & Electric Company Limited, Liverpool, England, a British company Application June 24, 1955, Serial No. 517,829

Claims priority, application Great Britain June 28, 1954

4 Claims. (Cl. 307—88.5)

This invention relates to electrical circuits including transistor devices and includes among its objects the provision of improved circuit arrangements for operating a transistor device in conjunction with a thermionic valve.

According to one aspect of the invention a transistor of the junction type is arranged to form the output load impedance or a part of the output load impedance of an amplifier stage embodying a thermionic valve.

The special features provided by such an arrangement result from the complementary nature of the two devices: while the thermionic valve is a potential controlled element characterised by high input impedance, the transistor which is basically a current controlled device, is capable of providing current and power gain at a high level of efficiency and with modest requirements concerning power supplies. Particular practical significance of such an arrangement arises in connection with circuits in which the valve used is of a type operating at extremely low power levels such as a valve of the subminiature class. A particular, although by no means exclusive application of such an arrangement is to the provision of electro-mechanical switching at low power levels and with a high efficiency.

According to another aspect of the invention bias current for reducing the collector current of a transistor is applied to the base electrode of such transistor by way of a non-linear circuit element, such as a junction type rectifier.

The above and still further aspects and features of the invention will be more readily apparent from the following description of a number of practical embodiments given in conjunction with the accompanying drawings in which:

Fig. 1 is a circuit diagram of one arrangement embodying a junction-type transistor of the p-n-p type.

Fig. 2 is a circuit diagram of an arrangement similar to Fig. 1 but embodying a junction transistor of the n-p-n type.

Figs. 3*a* and 3*b* are diagrams illustrating certain characteristics of a p-n-p type junction transistor.

Fig. 4 is a circuit diagram of a modified arrangement showing one manner of reducing the residual current in the collector branch of an arrangement similar to Fig.1.

Fig. 5 is a circuit diagram of another modified arrangement showing another way of reducing the residual collector current in an arrangement similar to Fig. 1.

Figure 6:
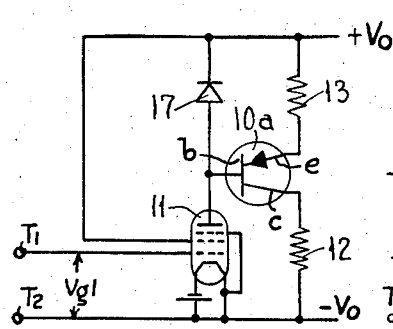

Fig. 6 is a circuit diagram of another modified arrangement in accordance with the invention showing a further and preferred manner of reducing the residual collector current in an arrangement similar to Fig. 1.

Figure 7:
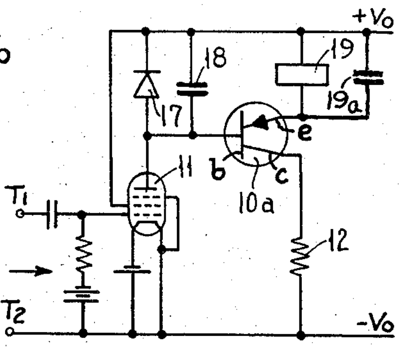

Fig. 7 is a circuit diagram of one practical form of relay operating circuit capable of control by an A.C. input signal.

Figure 8:
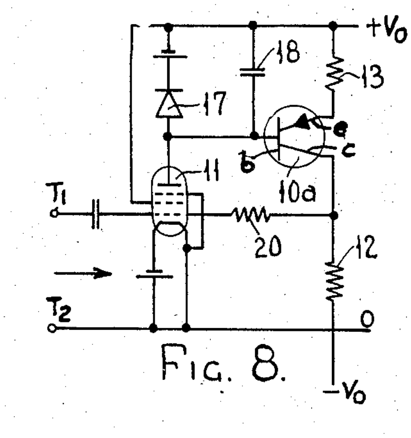

Fig. 8 is a circuit diagram of yet another modification incorporating positive feedback to provide a bistable trigger circuit arrangement.

Figure 9:
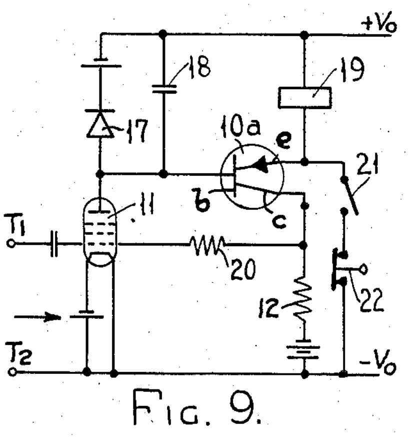

Fig. 9 is a circuit diagram of one practical embodiment utilising the bistable trigger circuit of Fig. 8.

Figure 10:
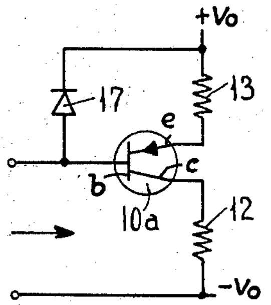

Fig. 10 is a circuit diagram illustrating an improved transistor.

Figure 11:
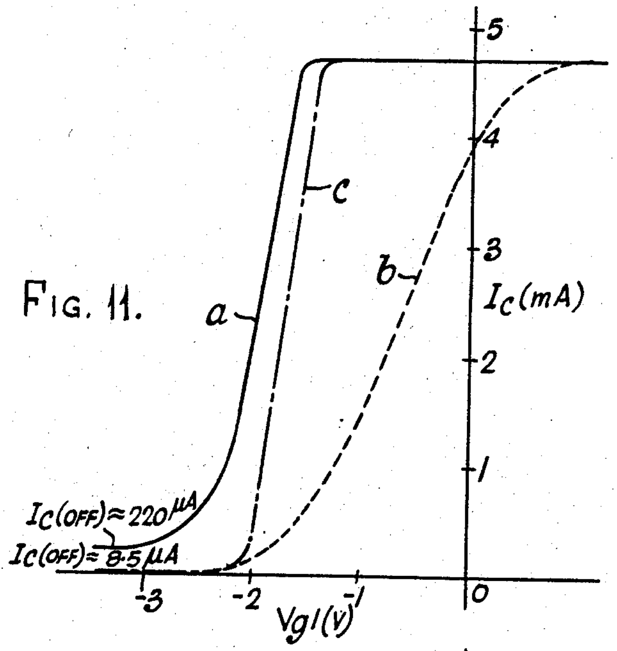
Figure 12:
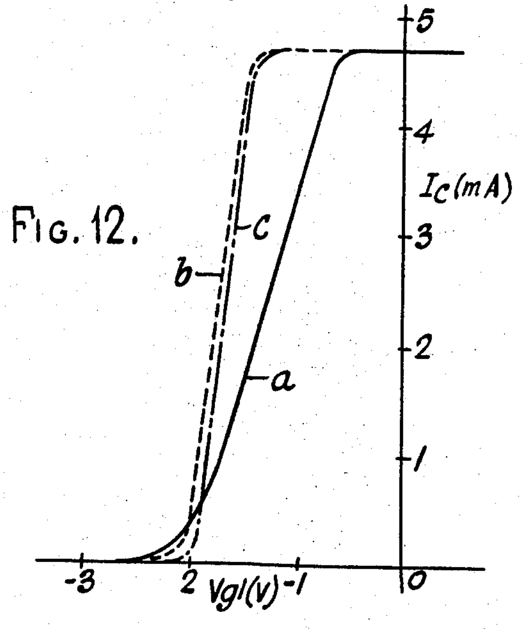

Figs. 11 and 12 are diagrams illustrating the overall transfer characteristics of certain combined transistor-thermionic valve arrangements according to Figs. 1, 2, 4, 5 and 6.

Referring first to Fig. 1, the arrangement there shown comprises a p-n-p junction type transistor **10*a* having the base input type of connection and disposed so as to form the anode load of a thermionic valve 11**. The base electrode *b* of the transistor is connected directly to the anode of the valve, the collector electrode *c* is connected by way of resistance or other equivalent impedance 12 to the negative (and conveniently earthed) terminal $-V_0$ of a source of operating potential while the emitter electrode *e* of the transistor is connected by way of another resistance or equivalent impedance 13 to the positive terminal $+V_0$ of said source of operating potential.

The valve 11 is shown as a pentode having its suppressor grid connected to its cathode which is connected directly to the negative terminal $-V_0$. The screen grid of the valve is connected, either directly as shown or through a voltage-dropping resistance to the aforesaid positive terminal $+V_0$. The control grid of the valve 11 is connected to terminal T1 which, in conjunction with terminal T2 connected to the valve cathode, serves to receive the input control signal voltage $V_g1$. The corresponding arrangement for an n-p-n junction type transistor **10*b*** is shown in Fig. 2.

With such alternative form of junction transistor the collector electrode *c* is connected by way of resistance 12 to the positive supply terminal $+V_0$ while the emitter electrode *e* is connected through its associated resistance 13 to the negative supply terminal $-V_0$.

In each of the above cases the resistances 12, 13 in the collector and emitter branches respectively of the transistor are chosen in such a manner that the base current-voltage characteristic forms a suitable load curve for the valve 11. The transistor thus acts as the load impedance of the thermionic valve in a manner such that each element provides suitable bias conditions for the desired mode of operation of the other. It will be appreciated that one of the resistances 12, 13 may be of zero value under some circumstances.

The performance of such a combination can be characterised by an overall mutual conductance $g_m^*$ defined as $\delta I/\delta V_g1$ where I may be either the current flowing through the collector electrode and resistor 12 or the current flowing through the emitter electrode and resistor 13 in both Figs. 1 and 2 since these two currents are almost equal differing only by the very small current through the base of the transistor. To a first approximation $$g_m^* = g_m \cdot (b-1)$$

for the current through the collector electrode and resistor 12 and $g_m^* = g_m \cdot b$ for the current through the emitter electrode and resistor 13 where $g_m$ is the mutual conductance of the valve and *b*, which equals $1/1-\alpha$, is the transistor base-to-emitter current gain factor. Since *b* may have values lying in the range of 10–120 for junction transistors at present available this means that $g_m^*$ values of the order of 1 a./v. can be achieved if high-slope valves are used. Of greater practical importance, however, is the fact that $g_m^*$ values of several ma./v.—corresponding to those encountered in valves operating at power levels of several watts—can be obtained even when valves in the sub-miniature class, with a power consumption of the order of only a few tens of milli-watts, are employed.

If the emitter and collector currents of a transistor are plotted as a function of the base voltage, the transfer characteristics so obtained are somewhat similar in shape to the grid voltage/anode current characteristics of a thermionic valve. Such a transistor characteristic can be divided into three distinct regions as shown in Figs. 3*a* and 3*b*. In the first region the transistor is essentially "off" ($V_b \approx V_1$), in the second or "gain" region, it operates as a current amplifier ($V_2 < V_b < V_1$), while in the third or "on" region ($V_b < V_2$) the collector-base voltage is essentially zero and currents are limited by external resistances. In spite of this similarity in the shape of the valve and the transistor characteristics under such conditions, there exist two important differences. Firstly, in the "gain" and "on" region and to a slight degree also in the "off" region power has to be supplied to the base input terminals; secondly, the "off" condition is characterised by the presence of a residual current in the collector branch which is strongly temperature dependent.

The first mentioned point concerns the fundamental difference between thermionic valve and transistor circuitry but ceases to have any practical significance in the compound valve-plus-transistor arrangement according to the invention since the signal input voltages are applied across the normal high impedance presented by the control-grid to cathode input of the thermionic valve.

The second effect may be troublesome. In the basic compound stage of Fig. 1 or 2 it is impossible even to reach the true "off" state since, once the valve anode current has been cut off, the base current will be zero and $V_b < V_1$, leading to residual currents of considerable magnitude (of the order of 50–200 micro-amperes for typical p–n–p transistors at 18° C.). These currents may form an obstacle to the practical application of the simple circuits of Figs. 1 and 2 in certain large signal applications such as switching or relay operation.

A typical transfer characteristic for a compound stage according to Fig. 1 is illustrated by the full line curve *a* in Fig. 11. This curve was obtained with a junction transistor type JT2B (B.T.H.) and valve type XFY41 (Hivac) using a potential $V_0$ of 23.5 volts and resistances 12 and 13 of values 1 kilohm and 4 kilohms respectively. With a filament consumption of 15 milliwatts (1.5 volts at 10 ma.) the total power consumption of the circuit in the "off" state (when $V_g1$ was −3 volts) was approximately 20 milli-watts whereas in the "on" state (when $V_g1$ was −1.5 volts) the total power consumption was 140 milliwatts. The overall mutual conductance $g_m$* was approximately 6 ma./v. As will be seen from Fig. 11, the collector current I*c* had a residual value of some 220 micro-amperes in the "off" state.

In order to reduce the collector and emitter currents when in the "off" state it is necessary that an adequate bias current to the base is available so as to keep the base voltage in the region $V_B \approx V_1$. Three alternate methods of achieving this are shown respectively in Figs. 4, 5 and 6.

In the arrangement illustrated in Fig. 4, a by-pass resistance 14 is provided between the anode of valve 11 and the positive potential supply terminal $+V_0$. As long as anode current flow in the valve 11 is cut off this resistance 14 will have the effect of providing a positive current into the base of the transistor **10*a* thus reducing the collector current under the "off" conditions. In order to be most effective the ohmic value of such resistance should be as small as possible but on the other hand, once the valve 11 conducts to its anode, this by-pass resistance 14 shunts the transistor input and hence has an adverse effect upon the overall gain; and should, under these conditions, be of as large a value as possible. A compromise choice of value for resistance 14** is accordingly necessary.

The dotted line curve *b* of Fig. 11 indicates the transfer characteristic obtained with an arrangement according to Fig. 4, using a resistance 14 of value 30 kilohms and the remaining components and circuit parameters as already mentioned in connection with curve *a* of Fig. 11. Although the residual collector current in the "off" state is reduced to a value of approximately 8.5 micro-amperes, the improvement is obtained at the cost of considerably reduced again.

Fig. 5 shows a modified arrangement which avoids the objections raised in connection with the Fig. 4 arrangement but requires an additional bias supply B+ which is of higher positive potential than the supply terminal $+V_0$. The required bias current to the base electrode in the "off" state is applied from the source B+ through a resistance 15 which is of a value large enough to make its shunting effect of negligible value when the circuit is in the "on" condition.

By making resistance 15 of sufficiently high value and by suitable choice of the additional bias potential B+ it is possible to reduce the collector current in the "off" condition to its minimum valve I*co* and to make the emitter current zero in such condition with only a negligible reduction in the overall gain of the compound stage. The full line curve *a* of Fig. 12 illustrates the characteristic obtained when the resistance 15 has a value of 100 kilohms and the source B+ a potential of 1.5 volts positive with respect to supply terminal $+V_0$, the remaining circuit parameters being as already described with reference to Fig. 1.

The presence of a value of resistance in the circuit of the base electrode which is large with respect to that in the emitter branch has the effect of amplifying any change in I*co* by a large factor and this may enhance the temperature sensitivity of the circuit to a high degree and so reduce the stability of the circuit with regard to thermal drifts.

A further and preferred alternative arrangement which combines the provision of bias current to the base electrode under the "off" condition with the absence of any shunting effect during the "on" condition while, at the same time, avoiding the drawbacks of the arrangement of Fig. 4 or Fig. 5, is shown in Fig. 6 and consists in the use of a non-linear resistance element 17 in place of resistance 14 or 15. The effective resistance of such non-linear element may be arranged to be close to zero when the transistor **10*a* is in the "off" state while its resistance becomes large compared with the transistor input impedance as soon as the valve 11 begins to conduct. Such non-linear element 17 may be a junction type rectifier connected as shown to the anode of valve 11 and returned to the positive supply terminal $+V_0$ or, with still further increase of efficiency, to a source of additional positive bias potential B+. As the non-linear element 17**, a germanium p-n diode is preferred since its characteristic closely approaches the ideal shape. The use of other types of non-linear element, such as point-contact rectifiers, is however possible, but may lead to significantly poorer characteristics.

The chain-dotted line curve *c* in Fig. 11 indicates the transfer characteristic obtained with an arrangement according to Fig. 6, using a germanium p-n junction rectifier type R50B (S.T.C.) as the non-linear element 17, the remaining circuit parameters being as already described with reference to Fig. 1. The same transfer characteristic is also shown by the dotted line curve *b* in Fig. 12 for comparison with the chain-dotted line curve *c* which illustrates the further improvement towards the ideal shape which is obtained when the element 17 is returned to a source of additional positive bias potential B+ which is 1.5 volts positive with respect to the supply terminal $+V_0$. With the last mentioned arrangement the collector current I*c* is reduced to its theoretical minimum value I*co* while the emitter current I*e* becomes zero without, however, introducing any high degree of temperature instability.

A further feature of practical interest in connection with any of the arrangements considered is that the overall large-input signal characteristics of this type of circuit are such that an A.C. signal applied to the control grid of valve 11 in the presence of a suitable D.C. bias voltage will give rise to a D.C. component in the emitter and collector branches of the transistor. In particular, the non-linear element or diode 17 in the arrangement of Fig.

6, in addition to its stabilising function, also improves the rectification characteristics of the circuit. If desired the rectification efficiency may be further increased as shown in Fig. 7 by the provision of a reservoir condenser 18 across the element 17. Such circuit of Fig. 7 illustrates one practical form of A.C. sensitive relay operating circuit in which the relay 19 is substituted for the emitter branch resistance 13. Such relay may be shunted by a condenser 19a.

In the application of any of the circuits described above to relay operation, the relay can form either the emitter or the collector load. A slight difference exists for the two connections, since in the "off" condition of the transistor the emitter current will be smaller than the collector current and can be made equal to zero. In the "on" condition the emitter current will exceed the collector current by the amount of the base current but for base to collector current gains of junction type transistors used in practice (exceeding, say, 15) this difference becomes insignificant. Medium sensitivity relays are to be preferred to those of high sensitivity, in order to avoid faulty operation by the residual "off" currents of the transistor. Where the current required to operate the relay approaches the maximum rated current of the transistor and where such a relay is to be held for an extended interval the transistor dissipation can be reduced by making use of an auxiliary "self-holding" circuit on the relay with simultaneous switching off of the transistor.

In view of the high overall gain and the practically negligible input admittance of the compound circuit it is possible to convert any of the circuits described above into a bistable trigger arrangement by the addition of a suitable positive D.C. feedback path. One example, illustrating the use of feedback path including resistance 20 (1.5 megohms) from the collector load resistance 12 (390 ohms) to the control grid of the valve 11 is shown in Fig. 8. In this particular arrangement, the other circuit parameters resemble the equivalents already described in connection with Figs. 1 and 6 except that the negative supply terminal $-V_0$ is 6 volts negative with respect to the earthed cathode of the valve 11 while the non-linear element 17 is provided with an additional bias potential of 1.5 volts positive with respect to supply terminal $+V_0$. With such an arrangement an A.C. input across terminals T1, T2 of less than 1.5 volts R.M.S. causes the circuit to assume the "off" state when the collector branch current is of the order of 10 microamperes (at 21° C.) and the total power consumption approximately 15 milli-watts. The "on" state is produced by the application of an A.C. input of more than 3.0 volts R.M.S. to terminals T1, T2 whereupon the collector current rises to a value of approximately 5 milliamperes and the total power consumption to approximately 150 milli-watts.

Other arrangements are obviously possible. Fig. 9 illustrates a practical circuit, substantially similar in its parameters to Fig. 8, for the operation of a relay 19 by a small A.C. voltage applied to the control grid of valve 11. This circuit arrangement is provided with triggering back coupling to the control grid of valve 11 through resistance 20 and includes a self-holding contact 21 operated by the relay 19 and a reset control switch 22, in the self-holding circuit.

Although the invention has been more particularly described with reference to relay control, it will be obvious that the combined junction transistor/thermionic valve arrangement has other applications including normal linear amplification of A.C. voltage (particularly for operation with a low impedance output load), pulse generation and amplification such as for use in electronic computers, signalling and so on.

I claim:

1. An electric amplifier circuit for providing a high value input impedance and a low value output impedance and comprising a thermionic valve having at least an anode, a control grid and a cathode whose heating power requirement does not exceed 100 milliwattts, a pair of input terminals for a high impedance voltage input connection, said terminals being connected respectively to said control grid and to said cathode, a p-n-p junction type transistor having a base electrode, an emitter electrode and a collector electrode, a source of operating potential for said transistor having its negative terminal connected to said cathode, first circuit means including an output load impedance connecting said emitter electrode to the positive terminal of said potential source, second circuit means connecting said collector electrode to said negative terminal of said potential source, third circuit means connecting said valve anode directly to said base electrode of said transistor, and a rectifier element connected directly between said base electrode and said positive terminal of said potential source, said rectifier element being poled to present a high resistance when the potential of said base electrode is sensibly more negative than said positive terminal of said potential source.

2. In a transistor amplifier circuit of the type employing a junction transistor having its emitter electrode connected by way of an output load impedance to one polarity terminal of a current supply source for said transistor, its collector electrode connected to the opposite polarity terminal of said current supply source and with a signal input connection to the base electrode of said transistor, the combination therewith of a thermionic valve having at least an anode, a control grid and a cathode, first circuit means connecting the anode of said valve directly to said base electrode, further circuit means connecting said cathode to the negative terminal of said current supply source, a pair of input terminals for connection to a high impedance input voltage source, said input terminals being connected respectively to said control grid and said cathode of said valve and a non-linear resistance element connected directly between said base electrode and said positive terminal of said current supply source, said resistance element being connected in such a manner that it exhibits a low resistance when said base electrode is at a potential approximating to that of said positive supply terminal but exhibits a high resistance value when the potential of said base electrode is sensibly lower than that of said positive supply terminal.

3. In a transistor amplifier circuit of the type employing a p-n-p junction transistor having its emitter electrode connected by way of an output load impedance to the positive polarity terminal of a current supply source for said transistor, its collector electrode connected through an impedance to the negative polarity terminal of said current supply source and with a signal input connection to the base electrode of said transistor, the combination therewith of a miniature thermionic valve having at least an anode, a control grid and a cathode whose heating power requirement does not exceed 50 milliwatts, first circuit means connecting the anode of said valve directly to said base electrode for the supply of anode current from said positive terminal through said load impedance and said emitter electrode, further circuit means connecting said cathode to the negative terminal of said current supply source, a pair of input terminals for connection to a high impedance input voltage source, said input terminals being connected respectively to said control grid and said cathode of said valve and a non-linear resistance element connected directly between said base electrode and said positive terminal of said current supply source, said resistance element being connected in such a manner that it exhibits a low resistance when said base electrode is at a potential approximating to that of said positive supply terminal but exhibits a high resistance value when the potential of said base electrode is sensibly lower than that of said positive supply terminal.

4. In a transistor amplifier circuit of the type employing a junction transistor having its emitter electrode connected by way of an output load impedance to one polarity terminal of a current supply source for said transistor, its collector electrode connected to the opposite polarity terminal of said current supply source and with a control signal input connection to the base electrode of said transistor, the combination therewith of a thermionic valve having at least an anode, a control grid and a cathode, first circuit means connecting the anode of said valve directly to said base electrode for the supply of anode current from the positive terminal of said current supply source through said transistor, further circuit means connecting said cathode to the negative terminal of said current supply source, a pair of input terminals for connection to a high impedance input control voltage source, said input terminals being connected respectively to said control grid and said cathode of said valve and a germanium junction type rectifier connected directly between said base electrode and said positive supply terminal, said rectifier being poled so that it exhibits a low resistance value when said base electrode is at a potential approximating to that of said positive supply terminal but rises to a high resistance value when the potential of said base electrode becomes sensibly lower than that of said positive supply terminal.

References Cited in the file of this patent

UNITED STATES PATENTS

| | | |
|---|---|---|
| 2,623,170 | Dickerson | Dec. 23, 1952 |
| 2,628,310 | Wood | Feb. 10, 1953 |
| 2,705,287 | Lo | Mar. 29, 1955 |
| 2,708,720 | Anderson | May 17, 1955 |
| 2,716,729 | Shockley | Aug. 30, 1955 |
| 2,750,456 | Waldhauer | June 12, 1956 |
| 2,751,550 | Chase | June 19, 1956 |

FOREIGN PATENTS

| | | |
|---|---|---|
| 673,604 | Great Britain | June 11, 1952 |